(12) United States Patent
Seo

(10) Patent No.: US 7,455,452 B2
(45) Date of Patent: Nov. 25, 2008

(54) TEMPERATURE SENSOR CAPABLE OF CONTROLLING SENSING TEMPERATURE

(75) Inventor: Young-Hun Seo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 96 days.

(21) Appl. No.: 11/337,498

(22) Filed: Jan. 24, 2006

(65) Prior Publication Data

US 2006/0176052 A1 Aug. 10, 2006

(30) Foreign Application Priority Data

Feb. 7, 2005 (KR) .................. 10-2005-0011209

(51) Int. Cl.
*G01K 7/14* (2006.01)
*H03K 17/00* (2006.01)
*H03K 3/011* (2006.01)

(52) U.S. Cl. .................. 374/171; 374/163; 374/183; 374/178; 327/513; 327/83; 702/99

(58) Field of Classification Search ......... 374/170–173, 374/163, 183, 185, 178; 702/130, 131, 99; 327/512, 513, 83, 307

See application file for complete search history.

(56) References Cited

U.S. PATENT DOCUMENTS

| | | | | |
|---|---|---|---|---|
| 3,459,925 A * | 8/1969 | Wilson et al. | ............... | 376/207 |
| 4,636,092 A * | 1/1987 | Hegyi | ........................ | 374/178 |
| 4,760,285 A * | 7/1988 | Nelson | ........................ | 327/511 |
| 5,226,733 A * | 7/1993 | Mitchell et al. | ............. | 374/172 |
| 5,361,042 A * | 11/1994 | Gist | ............................ | 330/261 |
| 5,608,347 A * | 3/1997 | Kearney | ..................... | 327/512 |
| 6,011,422 A * | 1/2000 | Koglin et al. | ............... | 327/357 |
| 6,031,407 A | 2/2000 | Cordoba et al. | | |
| 6,275,098 B1 * | 8/2001 | Uehara et al. | ............... | 327/539 |
| 6,280,081 B1 * | 8/2001 | Blau et al. | ..................... | 374/1 |
| 6,320,450 B1 * | 11/2001 | Lee et al. | .................... | 327/513 |
| 6,441,674 B1 * | 8/2002 | Lin | .............. | 327/512 |
| 6,462,588 B2 * | 10/2002 | Lau et al. | .................... | 327/108 |
| 6,549,053 B1 * | 4/2003 | Evans et al. | ................. | 327/307 |
| 6,724,196 B1 * | 4/2004 | Chiaro et al. | ............... | 324/609 |
| 6,822,501 B2 * | 11/2004 | Kinugasa | .................... | 327/307 |

(Continued)

FOREIGN PATENT DOCUMENTS

JP 11-053882 2/1999

(Continued)

*Primary Examiner*—Gail Verbitsky
(74) *Attorney, Agent, or Firm*—Volentine & Whitt, PLLC

(57) ABSTRACT

A temperature sensor includes a reference voltage generator, a sensing temperature controller and a first differential amplifier. The reference voltage generator generates a reference voltage having a first slope that varies in accordance with variations of a peripheral temperature, and a temperature sensing voltage having a second slope that varies in accordance with variations of the peripheral temperature. The sensing temperature controller controls an offset of an amplifier in response to a first control signal, and amplifies a voltage difference between the reference voltage and the temperature sensing voltage to generate a first differential output signal, and a second differential output signal having an inverted phase of the first differential output signal. The first differential amplifier amplifies a voltage difference between the first differential output signal and the second differential output signal to generate a sensor output signal.

19 Claims, 13 Drawing Sheets

U.S. PATENT DOCUMENTS

| | | | |
|---|---|---|---|
| 6,889,152 B2* | 5/2005 | More | 702/99 |
| 6,921,199 B2* | 7/2005 | Aota et al. | 374/178 |
| 7,033,072 B2* | 4/2006 | Aota et al. | 374/178 |
| 7,075,353 B1* | 7/2006 | Wan et al. | 327/295 |
| 7,078,955 B2* | 7/2006 | Kim et al. | 327/512 |
| 7,197,421 B2* | 3/2007 | Pan | 702/133 |
| 7,227,389 B2* | 6/2007 | Gong et al. | 327/83 |
| 2003/0006822 A1* | 1/2003 | Murakami et al. | 327/513 |
| 2004/0102914 A1* | 5/2004 | More | 702/99 |
| 2006/0018364 A1* | 1/2006 | Kim et al. | 374/183 |
| 2006/0153277 A1* | 7/2006 | Yoshida | 374/178 |
| 2006/0197581 A1* | 9/2006 | Chun et al. | 327/512 |
| 2007/0108954 A1* | 5/2007 | Qiu et al. | 323/284 |
| 2007/0109043 A1* | 5/2007 | Thiery | 330/9 |
| 2007/0188223 A1* | 8/2007 | Nishimori | 330/51 |
| 2008/0031304 A1* | 2/2008 | Nishimura | 374/178 |

FOREIGN PATENT DOCUMENTS

| | | |
|---|---|---|
| JP | 2003-288786 | 10/2003 |
| KR | 1020000042478 | 7/2000 |

* cited by examiner

TEMPERATURE SENSOR CAPABLE OF CONTROLLING SENSING TEMPERATURE

This application claims priority to Korean Patent Application No. 2005-11209 filed on Feb. 7, 2005, the subject matter of which is hereby incorporated by reference.

BACKGROUND OF THE INVENTION

1. Field of the Invention

Embodiments of the invention relate to a temperature sensor. More particularly, embodiments of the invention relate to a temperature sensor capable of linearly changing a sensing temperature.

2. Description of the Related Art

A temperature sensor is commonly applied to applications and systems incorporating one or more semiconductor devices in order to sense a peripheral temperature. As the peripheral temperature varies, the operating conditions of the circuit blocks included within the semiconductor integrated circuit are often modified in some controlled manner. For example, the dynamic random access memory (DRAM) used in mobile products may modify its refresh period in accordance with variation in peripheral temperature.

Figure (FIG.) 1 is a circuit diagram illustrating a conventional temperature sensor.

Referring to FIG. 1, the temperature sensor includes a reference voltage generator 10 and differential amplifiers 20, 30 and 40. The reference voltage generator 10 is a band-gap reference voltage generator well known to one of ordinary skill in the art.

A reference current IR is determined by a loop composed of NMOS transistors MN1 and MN2, a resistor RR and diodes D1 and D2. When the size ratio of diode D1 to diode D2 is M:1, a current flowing through the resistor RR, i.e., the reference current IR, may be represented by the following expression:

$$IR = k \cdot T/q \cdot \ln(M)/RR,$$

where 'k' denotes Boltzmann's Constant, 'T' denotes absolute temperature and 'q' denotes quantity of electric charge of an electron.

That is, the reference current IR increases proportionally to the absolute temperature T. The gate of the NMOS transistor MN2 and the gate of an NMOS transistor MN3 are coupled to an identical bias voltage, and the gate bias voltage decreases as the peripheral temperature increases. As a result, a current IA that flows through resistors R1 and R2 decreases proportionally with the absolute temperature.

FIG. 2A shows relationships between the currents IR and IA, and the peripheral temperature. As may be seen from these graphed relationships, the reference current IR increases as the peripheral temperature increases, and the current IA decreases as the peripheral temperature increases.

FIG. 2B shows relationships between a reference voltage OREF and a temperature sensing voltage OTA, and the peripheral temperature. Referring to FIG. 2B, the reference voltage OREF and the temperature sensing voltage OTA both increase as the peripheral temperature increases, but have different slopes. As may be seen in FIG. 2B, a graphical plot of the reference voltage OREF and temperature sensing voltage OTA as a function of temperature intersect at a single point. This point indicates a sensing temperature TS.

Referring back to FIG. 1, the reference voltage generator 10 outputs the temperature sensing voltage OTA and the reference voltage OREF to the differential amplifiers 20 and 30. The differential amplifier 20 amplifies a voltage difference between the temperature sensing voltage OTA and the reference voltage OREF to output a first differential output signal DIF01.

When the level of the temperature sensing voltage OTA becomes higher than that of reference voltage OREF, the output voltage TOUT increases, and when the level of the temperature sensing voltage OTA becomes lower than that of reference voltage OREF, the output voltage TOUT decreases. Thus, an increase in the output voltage TOUT indicates that the peripheral temperature is higher than a currently set sensing temperature, and a decrease in the output voltage TOUT indicates that the peripheral temperature is lower than the currently set sensing temperature.

As shown in FIG. 1, the conventional temperature sensor controls the sensing temperature by controlling each resistance value of resistor strings R1 through R6. Each of the resistance values of the resistor strings R1 through R6 is controlled by switching NMOS transistors MN4, MN5, MN6 and MN7 that are coupled in parallel with the resistors R3, R4, R5 and R6.

However, when the sensing temperature is adjusted by controlling the resistance value, the sensing temperature is nonlinearly varied in accordance with variations of the resistance value. Accordingly, the conventional temperature sensor shown in FIG. 1 is mainly used to test the temperature sensor in two, selected temperature conditions.

This limited ability is inadequate for emerging applications that require more precise sensing and corresponding control over the operation of semiconductor devices in response to variations in peripheral temperature. In sum, a temperature sensor capable of variously (including linearly) changing a sensing temperature is required.

SUMMARY OF THE INVENTION

Accordingly, embodiments of the present invention provide a temperature sensor capable of variously changing a sensing temperature. Embodiments of the present invention also provide a temperature sensor capable of linearly changing a sensing temperature. Embodiments of the present invention also provide a temperature sensing method capable of linearly changing a sensing temperature.

Thus, in one embodiment, the invention provides a temperature sensor comprising; a reference voltage generator configured to generate a reference voltage having a first slope that varies in accordance with variations of a peripheral temperature, and a temperature sensing voltage having a second slope that varies in accordance with variations of the peripheral temperature, a sensing temperature controller configured to control an offset of an amplifier in response to a first control signal, and configured to amplify a voltage difference between the reference voltage and the temperature sensing voltage to generate a first differential output signal and a second differential output signal, the second differential output signal having an inverted phase with respect to the first differential output signal, and a first differential amplifier configured to amplify a voltage difference between the first differential output signal and the second differential output signal to generate a sensor output signal.

In another embodiment, the invention provides a temperature sensor comprising; a reference voltage generator configured to generate a reference voltage having a first slope that varies in accordance with variations of a peripheral temperature, and a temperature sensing voltage having a second slope that varies in accordance with variations of the peripheral temperature, a sensing temperature controller configured to control an offset of an amplifier in response to a first control signal and an N-bit (where N is a natural number) digital code, and configured to amplify a voltage difference between the reference voltage and the temperature sensing voltage to generate a first differential output signal and a second differential output signal, wherein the second differential output signal has an inverted phase relative to the first differential output signal, and a first differential amplifier configured to amplify a voltage difference between the first differential output signal and the second differential output signal to generate a sensor output signal.

In yet another embodiment, the invention provides a temperature sensor comprising; a reference voltage generator configured to generate a reference voltage having a first slope that varies in accordance with variations of a peripheral temperature, and a temperature sensing voltage having a second slope that varies in accordance with variations of the peripheral temperature, a sensing temperature controller configured to control an offset of an amplifier in response to a sensor output signal, and configured to amplify a voltage difference between the reference voltage and the temperature sensing voltage to generate a first differential output signal and a second differential output signal, the second differential output signal having an inverted phase relative to the first differential output signal, and a first differential amplifier configured to amplify a voltage difference between the first differential output signal and the second differential output signal to generate a sensor output signal.

In still another embodiment, the invention provides a temperature sensing method comprising; generating a reference voltage having a first slope that varies in accordance with variations of a peripheral temperature, and a temperature sensing voltage having a second slope that varies in accordance with variations of the peripheral temperature, controlling an offset of an amplifier in response to a first control signal, and amplifying a voltage difference between the reference voltage and the temperature sensing voltage to generate a first differential output signal and a second differential output signal, wherein the second differential output signal has an inverted phase relative to the first differential output signal, and amplifying a voltage difference between the first differential output signal and the second differential output signal to generate a sensor output signal.

In still another embodiment, the invention provides a temperature sensing method comprising; generating a reference voltage having a first slope that varies in accordance with variations of a peripheral temperature, and a temperature sensing voltage having a second slope that varies in accordance with variations of the peripheral temperature, controlling an offset of an amplifier in response to a first control signal and an N-bit (where N is a natural number) digital code, and amplifying a voltage difference between the reference voltage and the temperature sensing voltage to generate a first differential output signal and a second differential output signal, wherein the second differential output signal has an inverted phase relative to the first differential output signal, and amplifying a voltage difference between the first differential output signal and the second differential output signal to generate a sensor output signal.

In still another embodiment, the invention provides a temperature sensing method comprising; generating a reference voltage having a first slope that varies in accordance with variations of a peripheral temperature, and a temperature sensing voltage having a second slope that varies in accordance with variations of the peripheral temperature, controlling an offset of an amplifier in response to a sensor output signal, and amplifying a voltage difference between the reference voltage and the temperature sensing voltage to generate a first differential output signal and a second differential output signal, wherein the second differential output signal has an inverted phase relative to the first differential output signal, and amplifying a voltage difference between the first differential output signal and the second differential output signal to generate a sensor output signal.

BRIEF DESCRIPTION OF THE DRAWINGS

The above and other features and advantages of the present invention will become more apparent upon consideration of several exemplary embodiments described with reference to the attached drawings in which.

DESCRIPTION OF THE EMBODIMENTS

Figure 1:
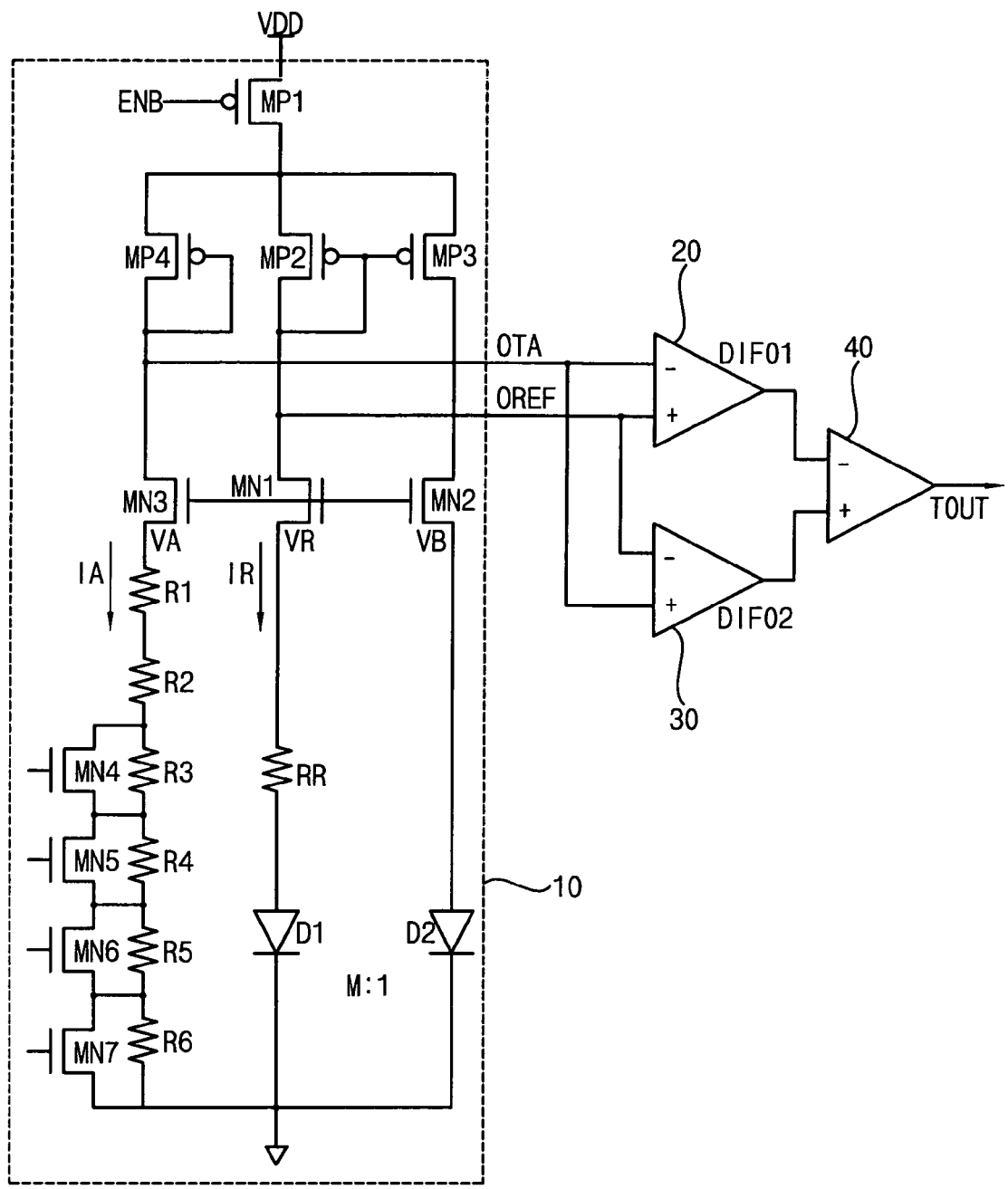
FIG. 1 is a circuit diagram illustrating a conventional temperature sensor.
Figure 2A:
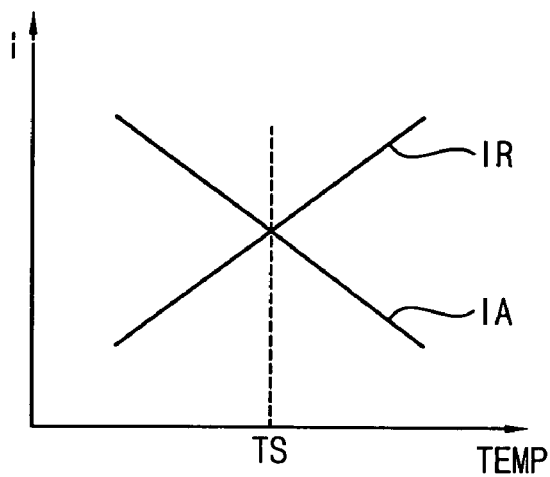
FIG. 2A is a graph illustrating relationships between currents IR and IA, and a peripheral temperature.
Figure 2B:
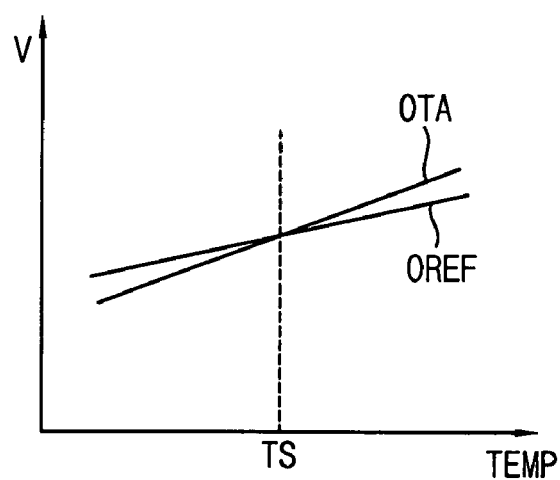
FIG. 2B is a graph illustrating relationships between a reference voltage OREF and a temperature sensing voltage OTA, and a peripheral temperature.

Several exemplary embodiments of the invention will now be disclosed. However, specific structural and functional details disclosed herein are merely representative and are presented as teaching examples. The invention may, however, be embodied in many alternate forms and should not be construed as being limited to only the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the scope of the invention as defined by the claims that follow. Like numbers refer to like or similar elements throughout the description that follow.

It will be understood that, although the terms first, second, etc. may be used herein to identify and describe various elements, such terms do not limit these elements to some artificially ordered arrangement. Rather, these terms are used merely to distinguish one element from another. For example, a first element could be termed a second element, and, similarly, a second element could be termed a first element, without departing from the scope of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
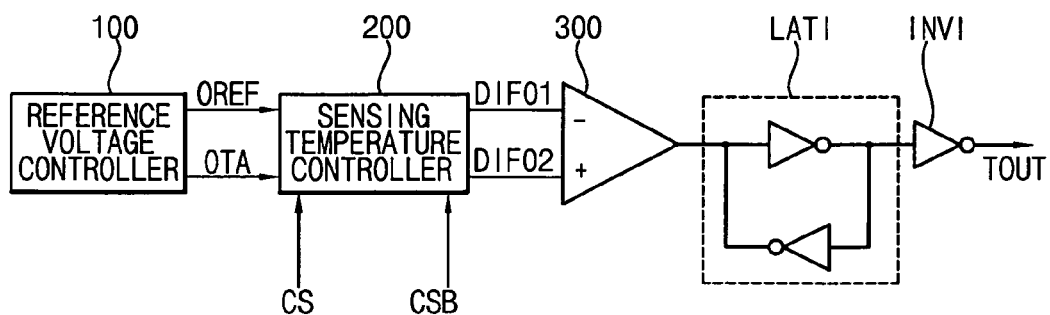
FIG. 3 is a circuit diagram illustrating a temperature sensor according to an example embodiment of the present invention.

FIG. 3 is a circuit diagram illustrating a temperature sensor according to an example embodiment of the present invention. Referring to FIG. 3, the temperature sensor generally comprises a reference voltage generator 100, a sensing temperature controller 200 and a differential amplifier 300.

Additionally, the temperature sensor may further include a latch LAT1 and an inverter INV1.

The reference voltage generator 100 generates a reference voltage OREF having a first slope that varies in accordance with variation of a peripheral temperature, and a temperature sensing voltage OTA having a second slope that also varies in accordance with variation of the peripheral temperature.

The sensing temperature controller 200 controls an offset of differential amplifiers 210 and 220 (refer to FIG. 4) in response to a control signal CS and an inverted control signal CSB, and amplifies a voltage difference between the reference voltage OREF and the temperature sensing voltage OTA to generate a first differential output signal DIF01 and a second differential output signal DIF02 that has an inverted phase of the first differential output signal DIF01.

The differential amplifier 300 amplifies a voltage difference between the first differential output signal DIF01 and the second differential output signal DIF02.

The latch LAT1 latches an output signal of the differential amplifier 300, and the inverter INV1 inverts an output signal of the latch LAT1.

Figure 4:
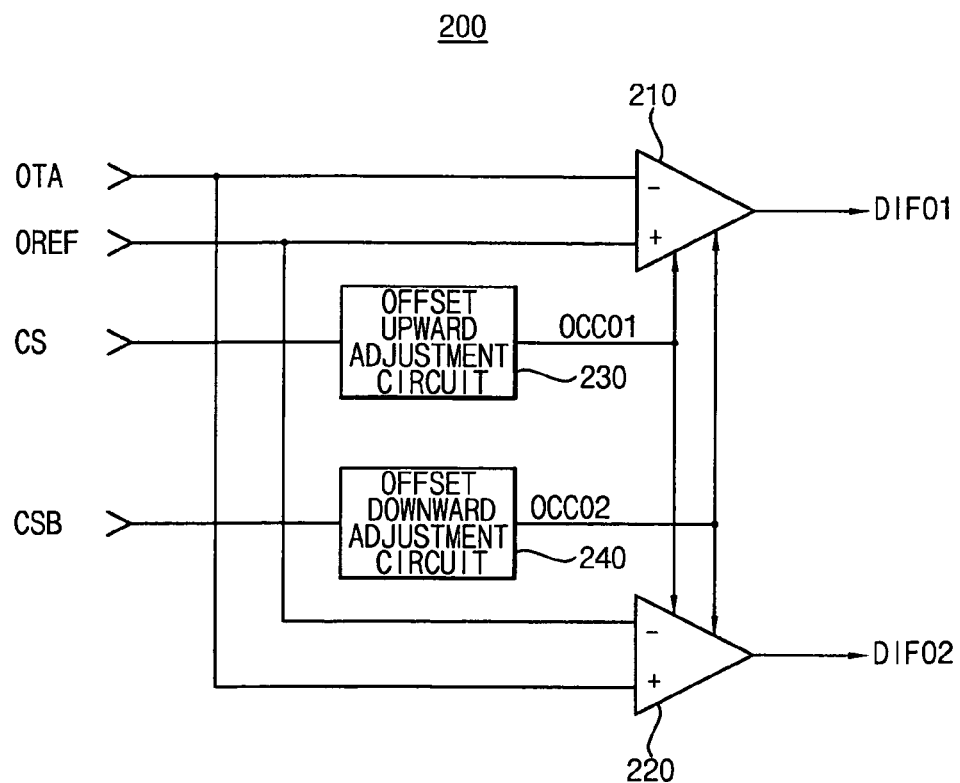
FIG. 4 is a circuit diagram illustrating a sensing temperature controller included in a temperature sensor shown in FIG. 3.

FIG. 4 is a circuit diagram illustrating a sensing temperature controller 200 included in a temperature sensor shown in FIG. 3. Referring to FIG. 4, the exemplary sensing temperature controller 200 includes an offset upward adjustment circuit 230, an offset downward adjustment circuit 240, a first differential amplifier 210 and a second differential amplifier 220.

The offset upward adjustment circuit 230 generates a first offset control signal OCC01 used for upwardly adjusting the offset of the differential amplifiers 210 and 220 in response to the control signal CS. The offset downward adjustment circuit 240 generates a second offset control signal OCC02 used for downwardly adjusting the offset of the differential amplifiers 210 and 220 in response to the inverted control signal CSB. The first differential amplifier 210 amplifies a voltage difference between the reference voltage OREF and the temperature sensing voltage OTA in response to the first offset control signal OCC01 and the second offset control signal OCC02, and generates the first differential output signal DIF01. The second differential amplifier 220 amplifies the voltage difference between the reference voltage OREF and the temperature sensing voltage OTA in response to the first offset control signal OCC01 and the second offset control signal OCC02, and generates the second differential output signal DIF02.

The first differential amplifier 210 has an inverted input terminal to which the temperature sensing voltage OTA is applied, a non-inverted input terminal to which the reference voltage OREF is applied and an output terminal from which the first differential output signal DIF01 is output.

The second differential amplifier 220 has an inverted input terminal to which the reference voltage OREF is applied, a non-inverted input terminal to which the temperature sensing voltage OTA is applied and an output terminal from which the second differential output signal DIF02 is output.

Figure 5:
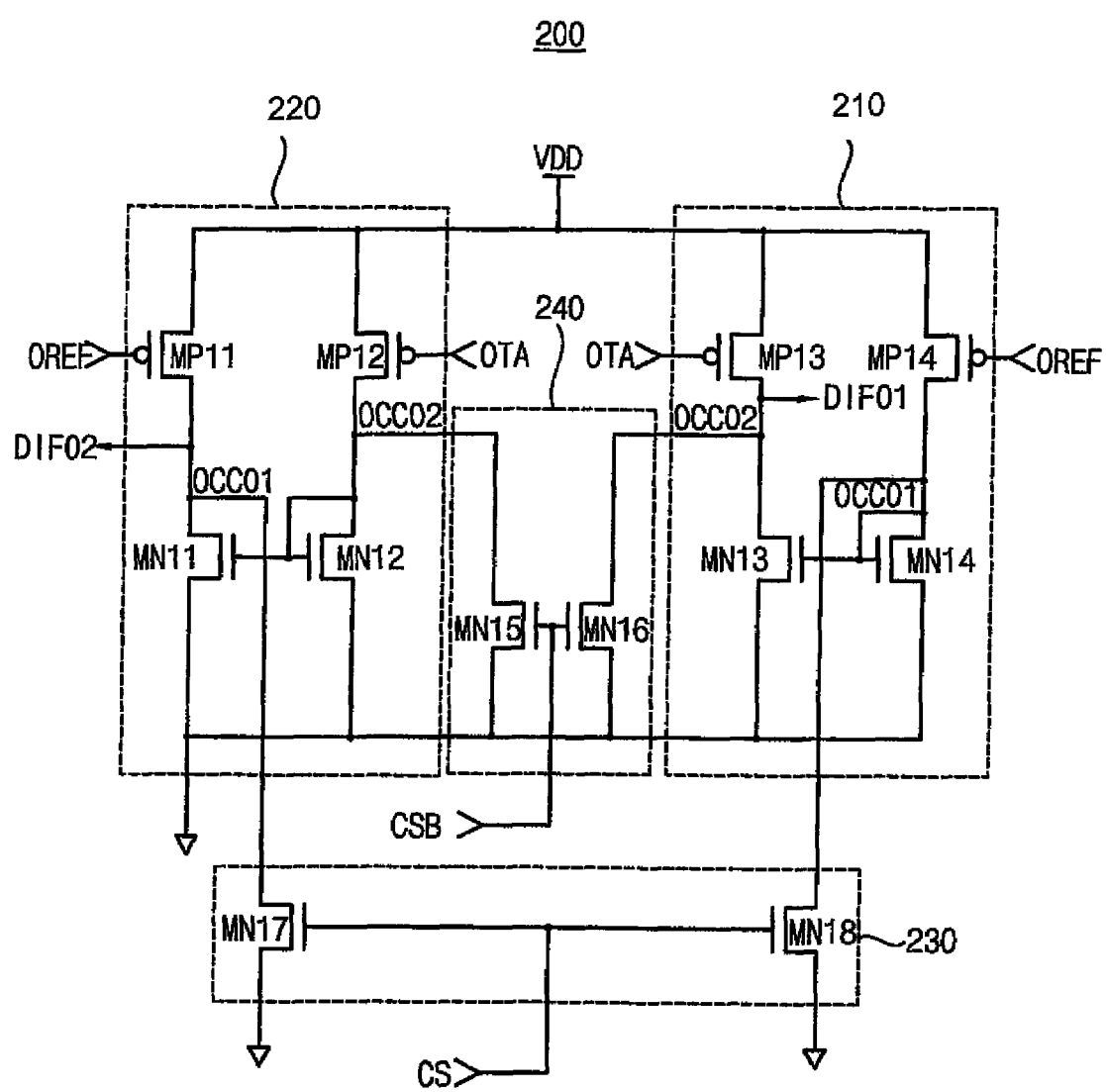
FIG. 5 is a detailed circuit diagram illustrating a sensing temperature controller shown in FIG. 4.

FIG. 5 is a detailed circuit diagram illustrating a sensing temperature controller 200 shown in FIG. 4. Referring to FIG. 5, the exemplary first differential amplifier 210 includes PMOS transistors MP13 and MP14, and NMOS transistors MN13 and MN14.

The PMOS transistor MP13 has a source coupled to a high power voltage VDD, a gate to which the temperature sensing voltage OTA is applied and a drain from which the first differential output signal DIF01 is output. The PMOS transistor MP14 has a source coupled to the high power voltage VDD and a gate to which the reference voltage OREF is applied. The NMOS transistor MN13 has a drain coupled to the drain of the PMOS transistor MP13, a gate coupled to a drain of the PMOS transistor MP14 and a source coupled to a low power voltage. The NMOS transistor MN14 has a drain and a gate commonly coupled to the drain of the PMOS transistor MP14, and a source coupled to the low power voltage.

The second differential amplifier 220 includes PMOS transistors MP11 and MP12, and NMOS transistors MN11 and MN12. The PMOS transistor MP11 has a source coupled to the high power voltage VDD, a gate to which the reference voltage OREF is applied and a drain from which the second differential output signal DIF02 is output. The PMOS transistor MP12 has a source coupled to the high power voltage VDD and a gate to which the temperature sensing voltage OTA is applied.

The NMOS transistor MN11 has drain copuled to the drain of the PMOS transistor MP11, a gate coupled to a drain of the PMOS transistor MP12 and a source coupled to the low power voltage. The NMOS transistor MN12 has a drain and a gate commonly coupled to the drain of the PMOS transistor MP12, and a source coupled to the low power voltage.

The first offset control signal OCC01 is applied to the drain of the NMOS transistor MN11 and the drain of the NMOS transistor MN14, and the second offset control signal OCC02 is applied to the drain of the NMOS transistor MN12 and the drain of the NMOS transistor MN13.

The offset upward adjustment circuit 230 includes NMOS transistors MN17 and MN18. The NMOS transistor MN17 has a drain coupled to the drain of the NMOS transistor MN11, a gate to which the control signal CS is applied and a source coupled to the low power voltage. The NMOS transistor MN18 has a drain coupled to the drain of the NMOS transistor MN14, a gate to which the control signal CS is applied and a source coupled to the low power voltage.

The offset downward adjustment circuit 240 includes NMOS transistors MN15 and MN16. The NMOS transistor MN15 has a drain coupled to the drain of the NMOS transistor MN12, a gate to which the inverted control signal CSB is applied and a source coupled to the low power voltage. The NMOS transistor MN16 has a drain coupled to the drain of the NMOS transistor MN13, a gate to which the inverted control signal CSB is applied and a source coupled to the low power voltage.

FIGS. 6A through 6D are simulation graphs illustrating relationships between a voltage and a peripheral temperature, which are main parameters of a sensing temperature controller such as the one shown in FIG. 5.

Figure 6A:
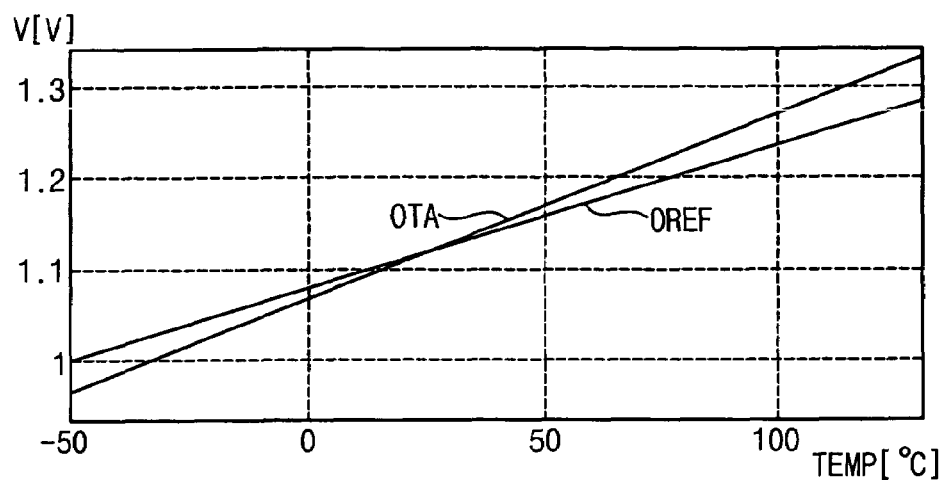
FIGS. 6A through 6D are simulation graphs illustrating relationships between a voltage and a peripheral temperature, which are main parameters of a sensing temperature controller shown in FIG. 5.

Referring to FIG. 6A, the reference voltage OREF and the temperature sensing voltage OTA both have linear relationships, but these relationships are defined by different slopes in relation to variations in the peripheral temperature. Here, the graph plots of the reference voltage OREF and the temperature sensing voltage OTA intersect at a single point. This point indicates a sensing temperature TS. In the illustrated example, the sensing temperature TS is about 45° C.

Figure 6B:
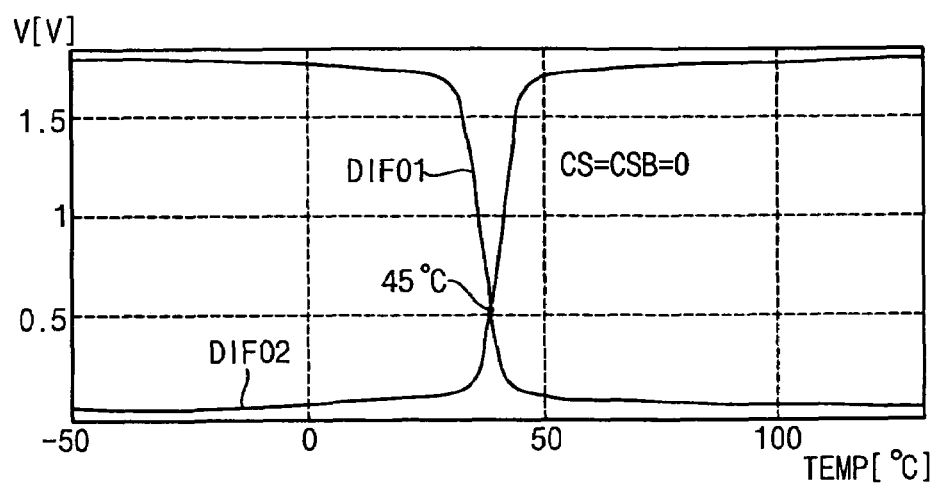

FIG. 6B is a voltage verses temperature graph illustrating waveforms of the first differential output signal DIF01 and the second differential output signal DIF02 that are output from the sensing temperature controller 200 when both the control signal CS and the inverted control signal CSB are logically "0". (Hereafter, different binary logic states for the exemplary control signals will be referred to as logic "1" and logic "0" values. Those of ordinary skill in the art will recognize that like PMOS and NMOS transistor uses, such logic distinctions may be easily reversed in some embodiments).

In FIG. 6B, an intersection point of the first differential output signal DIF01 and the second differential output signal DIF02 also indicates the sensing temperature TS of FIG. 6A, e.g., a sensing temperature TS of about 45° C.

Figure 6C:
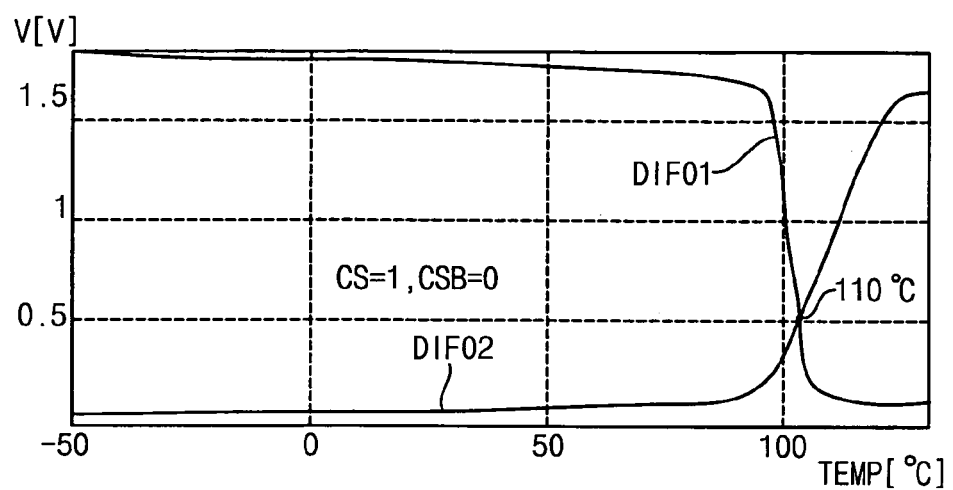

FIG. 6C is a voltage verses temperature graph illustrating waveforms of the first differential output signal DIF01 and the second differential output signal DIF02 that are output from the sensing temperature controller 200 when the control signal CS is at logic "1" and the inverted control signal CSB is at logic "0".

As shown in FIG. 6C, the exemplary, resulting sensing temperature TS is about 110° C. Referring back to FIG. 4, when the control signal CS is at logic "1" and the inverted control signal CSB is at logic "0", the offset upward adjustment circuit 230 is activated and the sensing temperature increases.

Figure 6D:
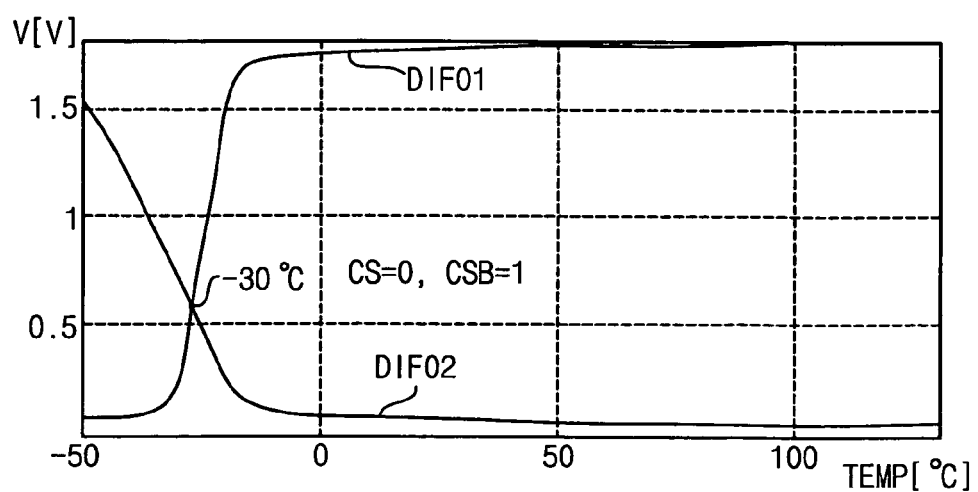

FIG. 6D is a voltage verses temperature graph illustrating waveforms of the first differential output signal DIF01 and the second differential output signal DIF02 that are output from the sensing temperature controller 200 when the control signal CS is at logic "0" and the inverted control signal CSB is at logic "1".

As shown in FIG. 6D, the exemplary resulting sensing temperature TS is about −30° C. Again, referring back to FIG. 4, when the control signal CS is at logic "0" and the inverted control signal CSB is at logic "1", the offset downward adjustment circuit 240 is activated and the sensing temperature decreases.

Hereinafter, operations of the temperature sensor according to an example embodiment of the present invention will be explained with reference to FIGS. 3 through 6D. Within this example, it is assumed that the reference voltage OREF and the temperature sensing voltage OTA have different slopes that both increase as the peripheral temperature increases. It is further assumed that for these two parameters, the plots of reference voltage OREF and the temperature sensing voltage OTA intersect at a single point. This intersection point indicates the sensing temperature TS.

With these assumptions in place, the sensing temperature controller 200 first determines whether the reference voltage OREF and the temperature sensing voltage OTA are identical to each other or not. When the temperature sensing voltage OTA increased compared with the reference voltage OREF, the first differential output signal DIF01 decreases and the second differential output signal DIF02 increases.

Thus, when the level of the temperature sensing voltage OTA is higher than that of the reference voltage OREF because the first differential output signal DIF01 and the second differential output signal DIF02 are inversely amplified by the differential amplifier 300, the output signal TOUT of the temperature sensor increases. That is, an increase of the output signal TOUT indicates that the level of the temperature sensing voltage OTA is higher than that of the reference voltage OREF, while a decrease of the output signal TOUT indicates that the level of the temperature sensing voltage OTA is lower than that of the reference voltage OREF A temperature sensor, such as the one shown in FIG. 3, may variously change the sensing temperature TS by changing the logic level of the control signal CS and the inverted control signal CSB that are applied to the sensing temperature controller 200.

Referring now to FIG. 6A through 6D, when the control signal CS and the inverted control signal CSB are not applied to the sensing temperature controller 200, the sensing temperature TS is about 45° C. When the control signal CS having a logic '1' level and the inverted control signal CSB having a logic '0' level are applied to the sensing temperature controller 200, the sensing temperature TS is about 110° C. When the control signal CS having the logic '0' level and the inverted control signal CSB having the logic '1' level are applied to the sensing temperature controller 200, the sensing temperature TS is about−30° C.

That is, when the control signal CS applied to the offset upward adjustment circuit 230 is at the logic '1' level and the inverted control signal CSB applied to the offset downward adjustment circuit 240 is at the logic '0' level, the sensing temperature TS increases. Conversely, when the control signal CS applied to the offset upward adjustment circuit 230 is at the logic '0' level and the inverted control signal CSB applied to the offset downward adjustment circuit 240 is at the logic '1' level, the sensing temperature TS decreases.

Thus, a temperature sensor designed in accordance with an embodiment of the present invention, such as the one shown in FIG. 3, may obtain various sensing temperatures by changing the logic level of the control signal CS and the inverted control signal CSB.

Figure 7:
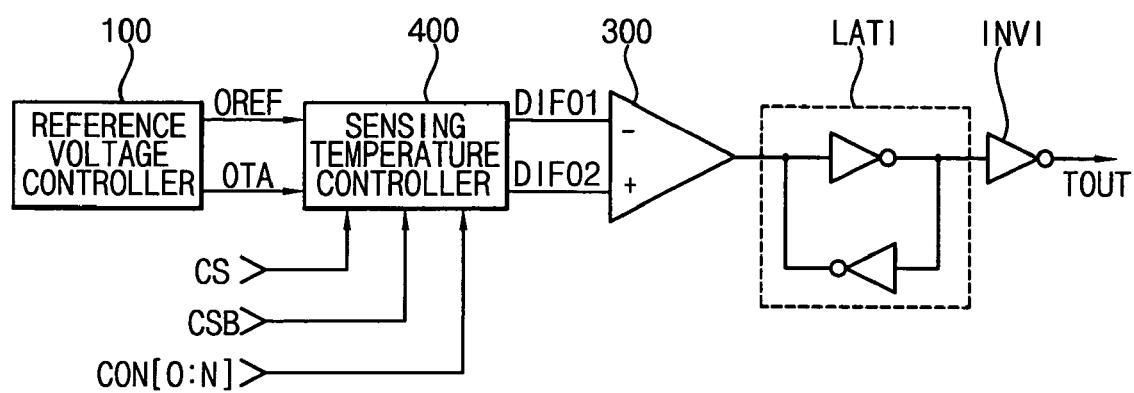
FIG. 7 is a circuit diagram illustrating a temperature sensor according to another example embodiment of the present invention.

FIG. 7 is a circuit diagram illustrating a temperature sensor according to another example embodiment of the present invention. Referring to FIG. 7, the temperature sensor generally comprises a reference voltage generator 100, a sensing temperature controller 400 and a differential amplifier 300.

Additionally, the temperature sensor may further include a latch LAT1 and an inverter INV1.

The reference voltage generator 100 generates a reference voltage OREF having a first slope that varies in accordance with variations of a peripheral temperature, and a temperature sensing voltage OTA having a second slope that varies in accordance with variations of the peripheral temperature.

The sensing temperature controller 400 controls an offset of differential amplifiers 410 and 420 (refer to FIG. 8) in response to a control signal CS, an inverted control signal CSB and an N-bit digital code CON[0:N], and amplifies a voltage difference between the reference voltage OREF and the temperature sensing voltage OTA to generate a first differential output signal DIF01 and a second differential output signal DIF02 that has an inverted phase of the first differential output signal DIF01.

The differential amplifier 300 amplifies a voltage difference between the first differential output signal DIF01 and the second differential output signal DIF02.

The latch LAT1 latches an output signal of the differential amplifier 300, and the inverter INV1 inverts an output signal of the latch LAT1.

Figure 8:
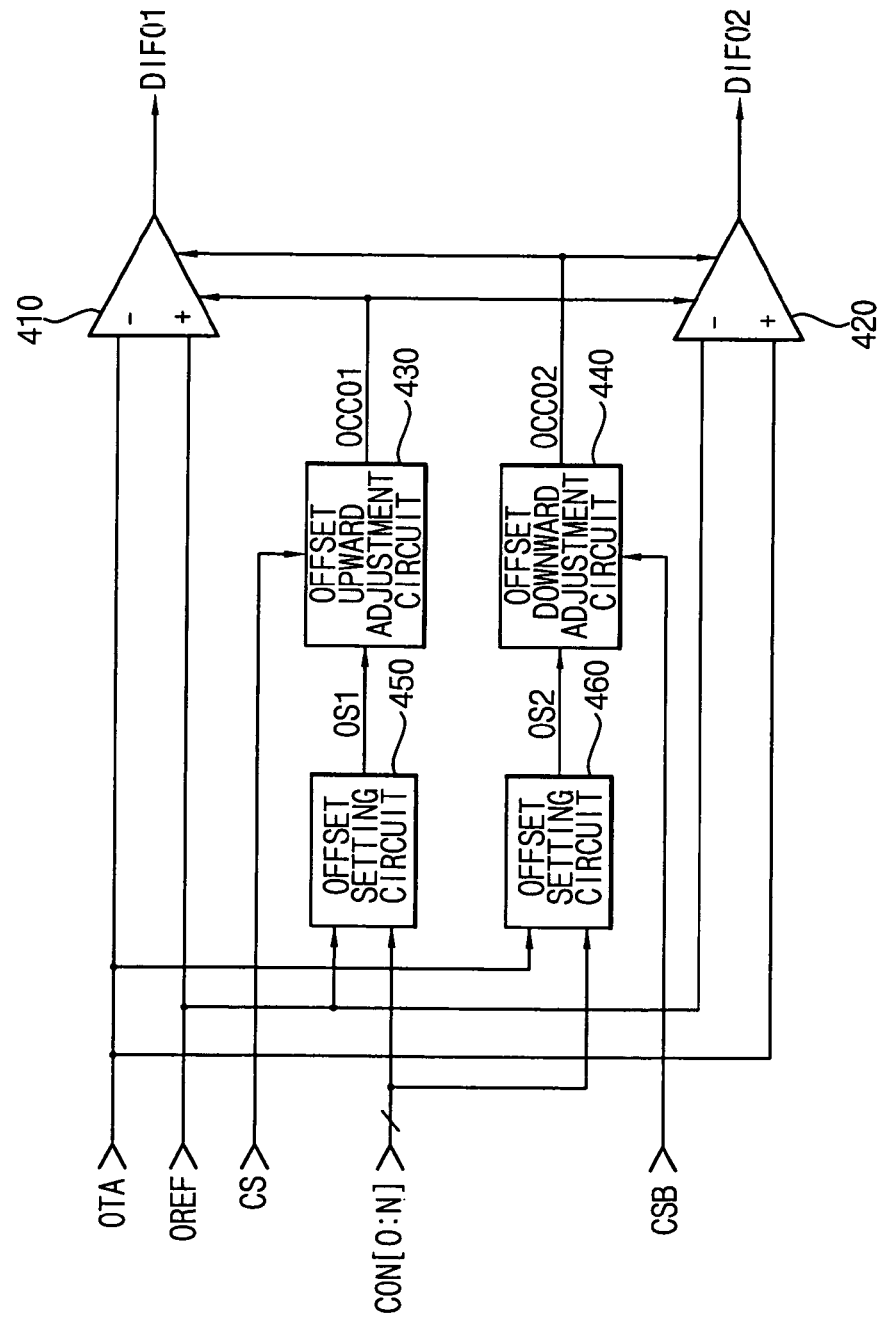
FIG. 8 is a circuit diagram illustrating a sensing temperature controller included in a temperature sensor shown in FIG. 7.

FIG. 8 is a circuit diagram illustrating an exemplary sensing temperature controller 400 adapted for use in a temperature sensor such as the one shown in FIG. 7.

Referring to FIG. 8, the sensing temperature controller 400 includes an offset upward adjustment circuit 430, an offset downward adjustment circuit 440, a first offset setting circuit 450, a second offset setting circuit 460, a first differential amplifier 410 and a second differential amplifier 420.

The first offset setting circuit 450 generates a first offset current OS1 used for setting an offset adjustment value in response to the reference voltage OREF and the N-bit digital code CON[0:N].

The offset upward adjustment circuit 430 generates a first offset control signal OCC01 used for upwardly adjusting the offset of the differential amplifiers 410 and 420 in response to the control signal CS and the first offset current OS1.

The second offset setting circuit 460 generates a second offset current OS2 used for setting an offset adjustment value in response to the temperature sensing voltage OTA and the N-bit digital code CON[0:N].

The offset downward adjustment circuit 440 generates a second offset control signal OCC02 used for downwardly adjusting the offset of the differential amplifiers 410 and 420 in response to the inverted control signal CSB and the second offset current OS2.

The first differential amplifier 410 amplifies a voltage difference between the reference voltage OREF and the temperature sensing voltage OTA in response to the first offset control signal OCC01 and the second offset control signal OCC02, and generates the first differential output signal DIF01.

The second differential amplifier 420 amplifies the voltage difference between the reference voltage OREF and the temperature sensing voltage OTA in response to the first offset control signal OCC01 and the second offset control signal OCC02, and generates the second differential output signal DIF02.

The first differential amplifier 410 has an inverted input terminal to which the temperature sensing voltage OTA is applied, a non-inverted input terminal to which the reference voltage OREF is applied, and an output terminal from which the first differential output signal DIF01 is output.

The second differential amplifier 420 has an inverted input terminal to which the reference voltage OREF is applied, a non-inverted input terminal to which the temperature sensing voltage OTA is applied, and an output terminal from which the second differential output signal DIF02 is output.

Figure 9:
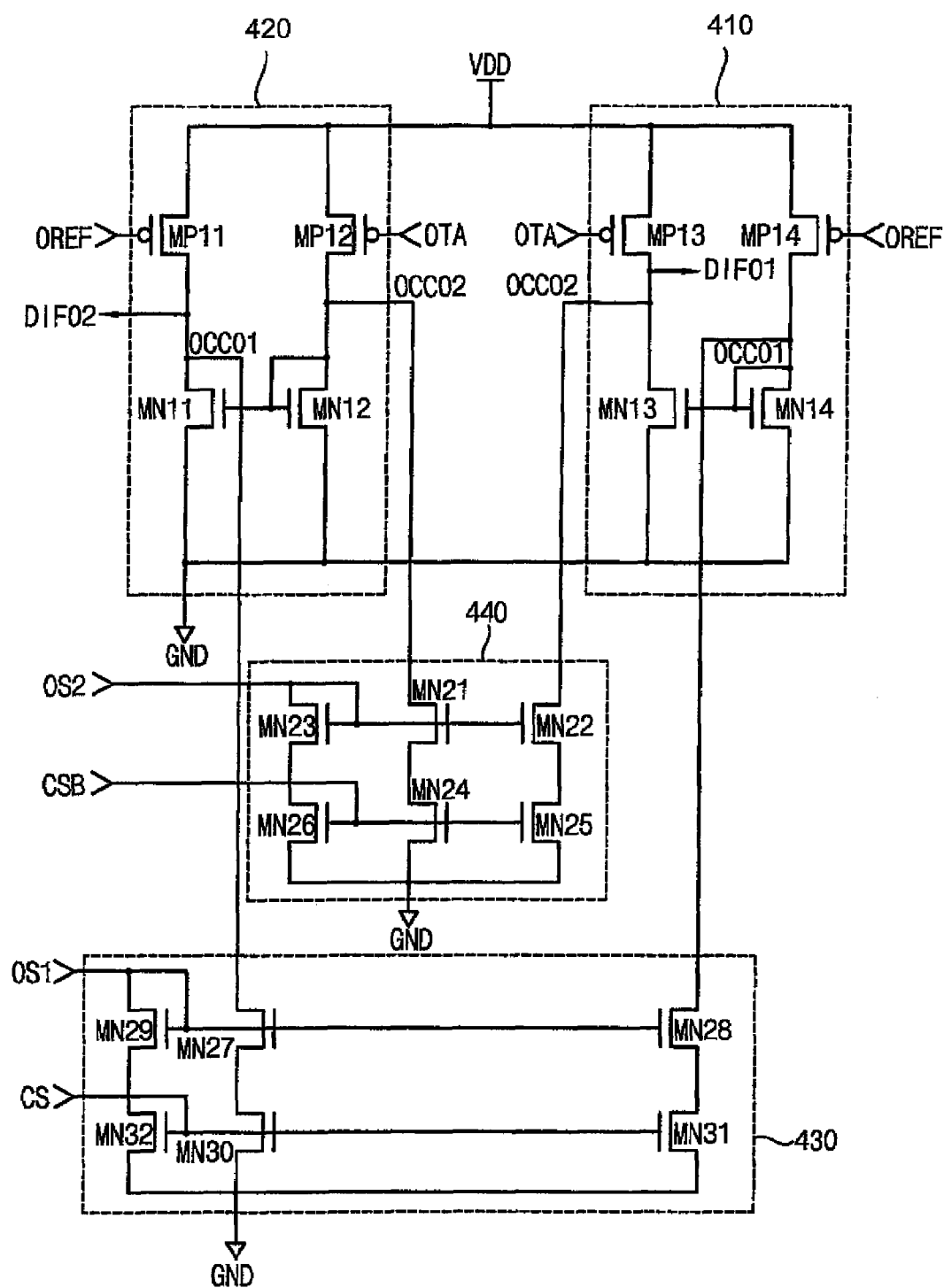
FIG. 9 is a detailed circuit diagram illustrating a sensing temperature controller shown in FIG. 8.

FIG. 9 is a detailed circuit diagram illustrating a sensing temperature controller 400 shown in FIG. 8. Referring to FIG. 9, the first differential amplifier 410 includes PMOS transistors MP13 and MP14, and NMOS transistors MN13 and MN14.

The PMOS transistor MP13 has a source coupled to a high power voltage VDD, a gate to which the temperature sensing voltage OTA is applied and a drain from which the first differential output signal DIF01 is output. The PMOS transistor MP14 has a source coupled to the high power voltage VDD and a gate to which the reference voltage OREF is applied. The NMOS transistor MN13 has a drain coupled to the drain of the PMOS transistor MP13, a gate coupled to a drain of the PMOS transistor MP14 and a source coupled to a low power voltage. The NMOS transistor MN14 has a drain and a gate commonly coupled to the drain of the PMOS transistor MP14, and a source coupled to the low power voltage.

The second differential amplifier 420 includes PMOS transistors MP11 and MP12, and NMOS transistors MN11 and MN12. The PMOS transistor MP11 has a source coupled to the high power voltage VDD, a gate to which the reference voltage OREF is applied and a drain from which the second differential output signal DIF02 is output. The PMOS transistor MP12 has a source coupled to the high power voltage VDD and a gate to which the temperature sensing voltage OTA is applied. The NMOS transistor MN11 has a drain coupled to the drain of the PMOS transistor MP11, a gate coupled to a drain of the PMOS transistor MP12 and a source coupled to the low power voltage. The NMOS transistor MN12 has a drain and a gate commonly coupled to the drain of the PMOS transistor MP12, and a source coupled to the low power voltage.

The first offset control signal OCC01 is applied to the drain of the NMOS transistor MN11 and the drain of the NMOS transistor MN14, and the second offset control signal OCC02 is applied to the drain of the NMOS transistor MN12 and the drain of the NMOS transistor MN13.

The offset upward adjustment circuit 430 includes NMOS transistors MN27 through MN32. The NMOS transistor MN27 has a drain coupled to the drain of the NMOS transistor MN11 and a gate to which the first offset current IS1 is applied. The NMOS transistor MN28 has a drain coupled to the drain of the NMOS transistor MN14 and a gate to which the first offset current IS1 is applied. The NMOS transistor MN29 has a gate and a drain to which the first offset current IS1 is applied. The NMOS transistor MN30 has a drain coupled to a source of the NMOS transistor MN27, a gate to which the control signal CS is applied and a source coupled to the low power voltage. The NMOS transistor MN31 has a drain coupled to a source of the NMOS transistor MN28, a gate to which the control signal CS is applied and a source coupled to the low power voltage. The NMOS transistor MN32 has a drain coupled to a source of the NMOS transistor MN29, a gate to which the control signal CS is applied and a source coupled to the low power voltage.

The offset downward adjustment circuit 440 includes NMOS transistors MN21 through MN26. The NMOS transistor MN21 has a drain coupled to the drain of the NMOS transistor MN12 and a gate to which the second offset current OS2 is applied. The NMOS transistor MN22 has a drain coupled to the drain of the NMOS transistor MM13 and a gate to which the second offset current OS2 is applied. The NMOS transistor MN23 has a gate and a drain to which the second offset current OS2 is applied. The NMOS transistor MN24 has a drain coupled to a source of the NMOS transistor MN21, a gate to which the inverted control CSB signal is applied and a source coupled to the low power voltage. The NMOS transistor MN25 has a drain coupled to a source of the NMOS transistor MN22, a gate to which the inverted control CSB signal is applied and a source coupled to the low power voltage. The NMOS transistor MN26 has a drain coupled to a source of the NMOS transistor MN23, a gate to which the inverted control CSB signal is applied and a source coupled to the low power voltage.

Figure 10:
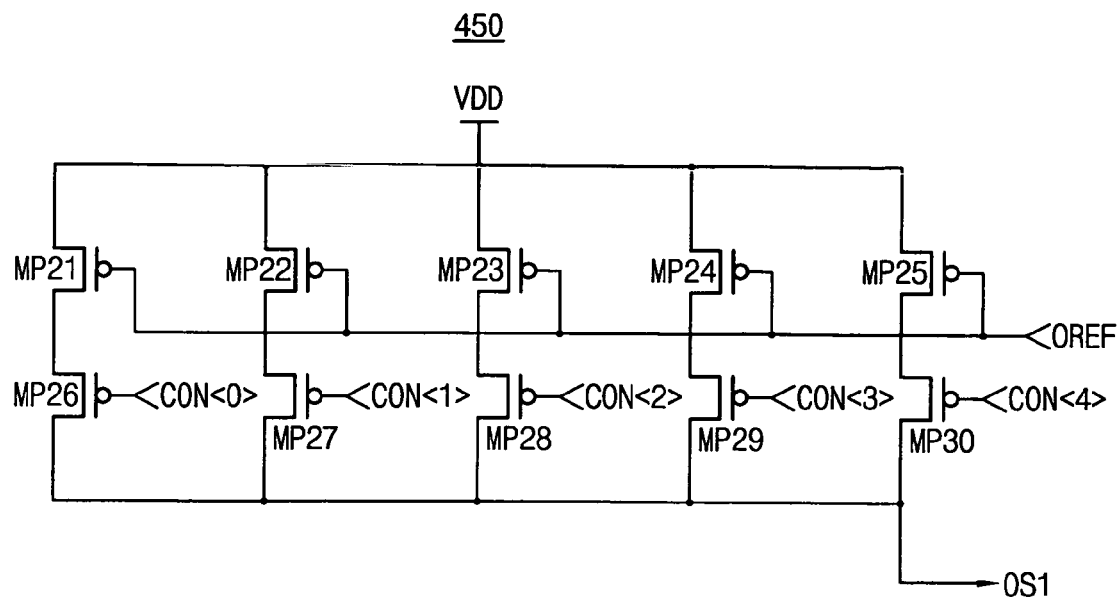
FIGS. 10 and 11 are circuit diagrams illustrating an offset setting circuit included in a sensing temperature controller shown in FIG. 8.
Figure 11:
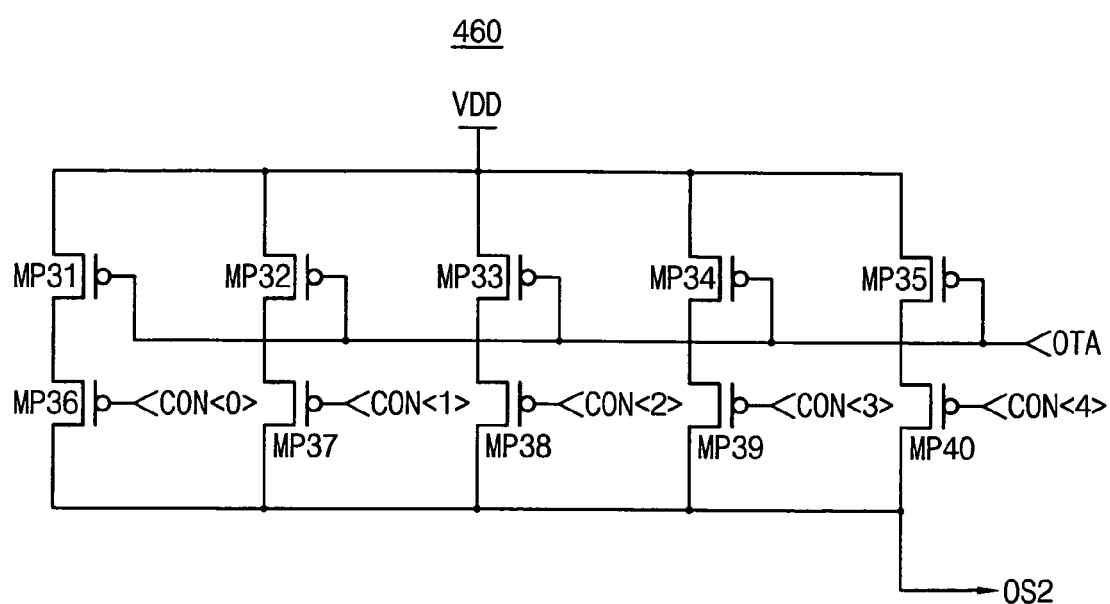

FIGS. 10 and 11 are circuit diagrams illustrating offset setting circuits 450 and 460 included in a sensing temperature controller 400 shown in FIG. 8. As illustrative examples, FIGS. 10 and 11 show the offset setting circuits 450 and 460 as controlled based on an assumed 5-bit digital code CON[0:4]. Naturally, this assumption is merely indicative of an exemplary embodiment of the present invention, and any reasonable digital code (e.g., length and type) might otherwise be used.

Referring to FIG. 10, the first offset setting circuit 450 includes first PMOS transistors MP21 through MP25, and second PMOS transistors MP26 through MP30. Each of the first PMOS transistors MP21 through MP25 has a source commonly coupled to the high power voltage VDD and a gate commonly controlled based on the reference voltage OREF.

Each of the second PMOS transistors MP26 through MP30 has a source coupled to a drain of each of the first PMOS transistors MP21 through MP25, a gate controlled based on each bit constituting the 5-bit digital code CON<0:4>, and a drain from which the first offset current OS1 is output.

Referring to FIG. 11, the second offset setting circuit 460 includes first PMOS transistors MP31 through MP35, and second PMOS transistors MP36 through MP40. Each of the first PMOS transistors MP31 through MP35 has a source commonly coupled to the high power voltage VDD and a gate commonly controlled based on the temperature sensing voltage OTA. Each of the second PMOS transistors MP36 through MP40 has a source coupled to a drain of each of the first PMOS transistors MP31 through MP35, a gate controlled based on each bit constituting the 5-bit digital code CON<0:4>, and a drain from which the second offset current OS2 is output.

In the example embodiment of the present invention, the 5-bit digital code CON[0:4] is applied to the offset setting circuits 450 and 460. In alternative embodiments, the digital code CON[0:N] may be composed of arbitrary bits, and the offset setting circuits 450 and 460 to which the digital code CON[0:N] composed of arbitrary bits is applied may be easily implemented.

Figure 12:
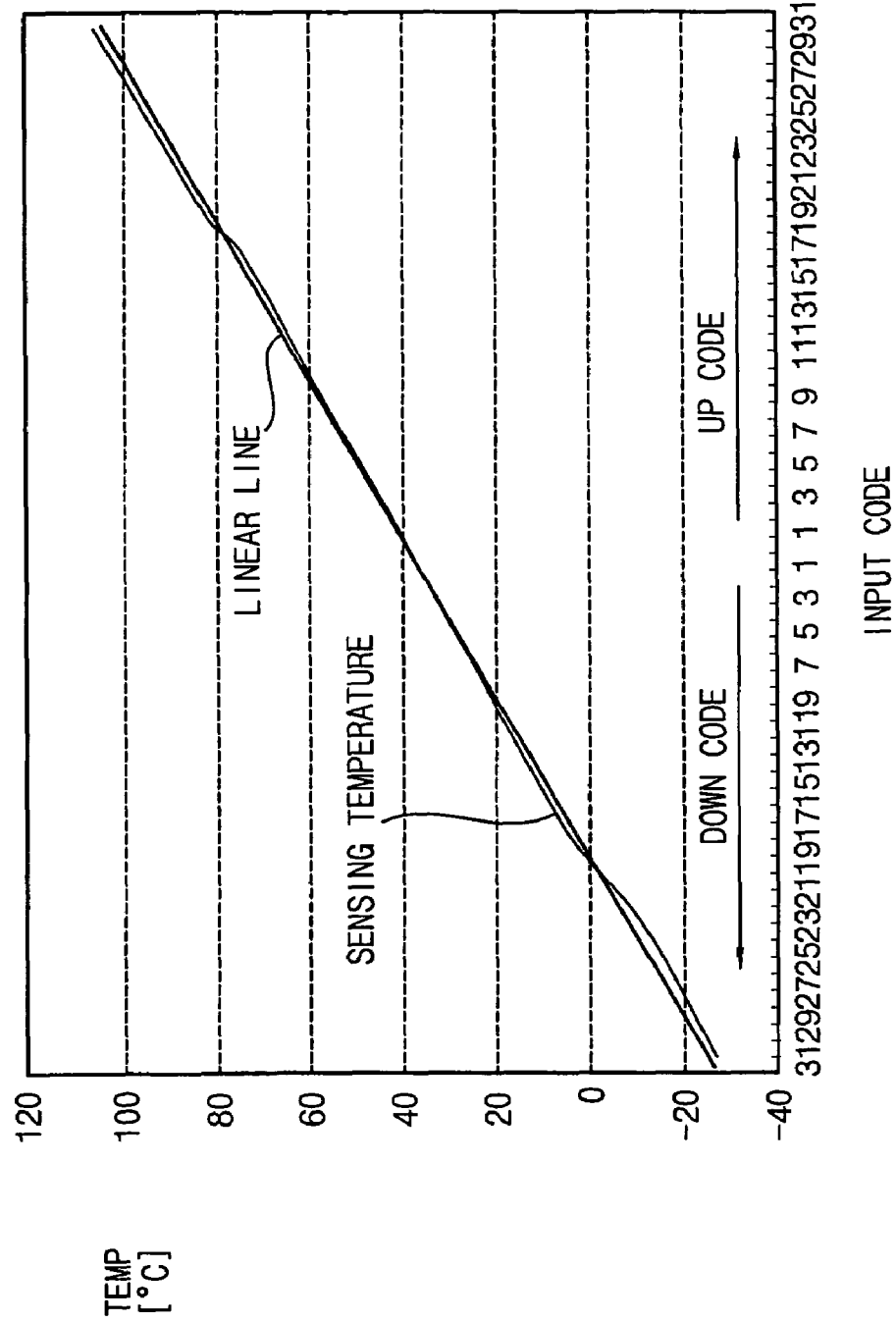
FIG. 12 is a graph illustrating variation of a sensing temperature based on code variation of an offset control signal in a temperature sensor shown in FIG. 7.

FIG. 12 is a graph illustrating variation of a sensing temperature based on code variation of an offset control signal in a temperature sensor such as the one shown in FIG. 7. As shown in FIG. 12, an input code includes 32-bit down code and 32-bit up code. Sixty-four (64) different codes may be generated using the 5-bit digital code CON[0:5], where the control signal CS is used for one of the bits. As is illustrated by the graph plot shown in FIG. 12, the sensing temperature may be linearly varied in accordance with the respectively generated codes.

The temperature sensor shown in FIGS. 7 through 11 according to another example embodiment of the present invention may control the sensing temperature based on 64 different codes using the 5-bit digital code CON[0:4] as well as the control signal CS and inverted control signal CSB as applied to the sensing temperature controller 400.

Figure 13:
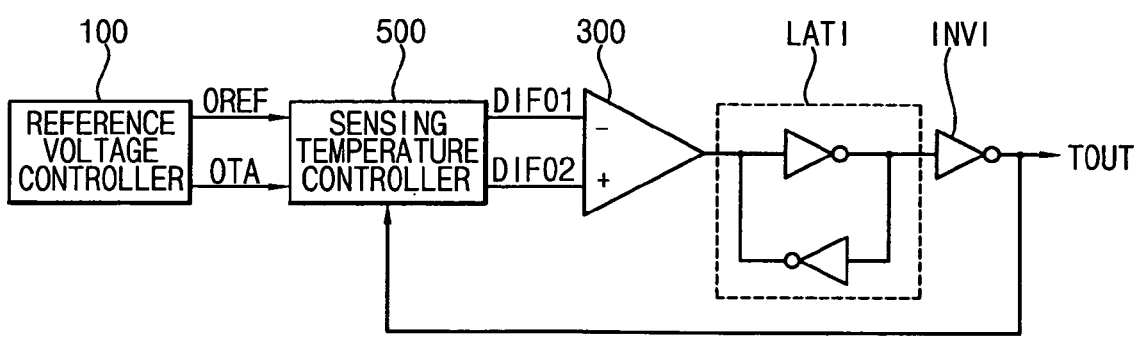
FIG. 13 is a circuit diagram illustrating a temperature sensor according to another example embodiment of the present invention.

FIG. 13 is a circuit diagram illustrating a temperature sensor according to another example embodiment of the present invention. Referring to FIG. 13, the temperature sensor generally comprises a reference voltage generator 100, a sensing temperature controller 500 and a differential amplifier 300. Additionally, the temperature sensor may further include a latch LAT1 and an inverter INV1.

The reference voltage generator 100 generates a reference voltage OREF having a first slope that varies in accordance with variations of a peripheral temperature, and a temperature sensing voltage OTA having a second slope that varies in accordance with variations of the peripheral temperature.

The sensing temperature controller 500 controls an offset of differential amplifiers 510 and 520 (refer to FIG. 14) in response to an output signal TOUT of the temperature sensor, and amplifies a voltage difference between the reference voltage OREF and the temperature sensing voltage OTA to generate a first differential output signal DIF01 and a second differential output signal DIF02 that has an inverted phase of the first differential output signal DIF01.

The differential amplifier 300 amplifies a voltage difference between the first differential output signal DIF01 and the second differential output signal DIF02. The latch LAT1 latches an output signal of the differential amplifier 300, and the inverter INV1 inverts an output signal of the latch LAT1.

Figure 14:
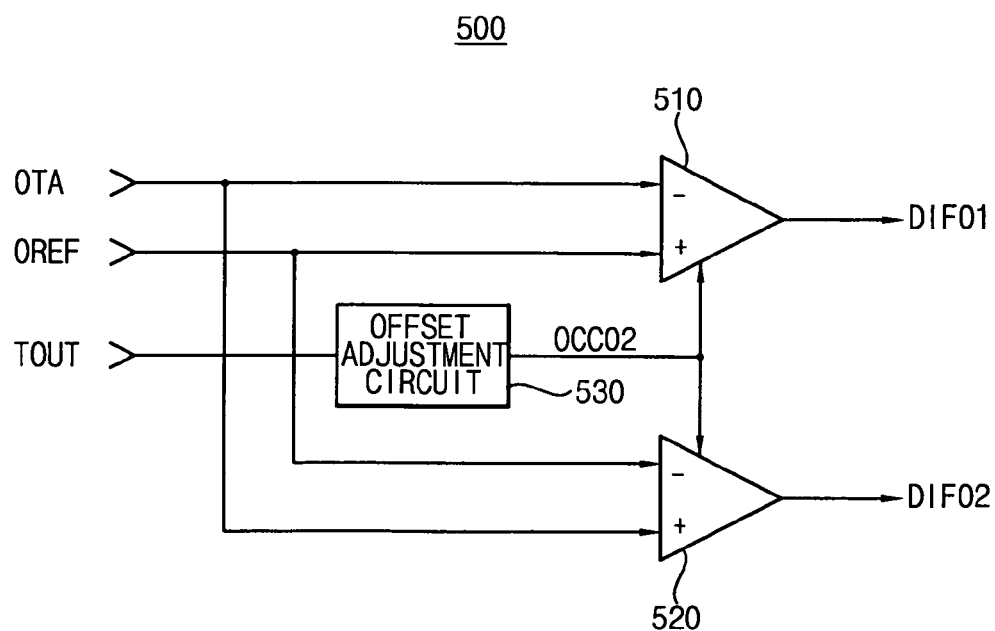
FIG. 14 is a circuit diagram illustrating a sensing temperature controller included in a temperature sensor shown in FIG. 13.

FIG. 14 is a circuit diagram illustrating a sensing temperature controller 500 adapted for use within a temperature sensor such as the one shown in FIG. 13. Referring to FIG. 14, the sensing temperature controller 500 includes an offset adjustment circuit 530, a first differential amplifier 510 and a second differential amplifier 520.

The offset adjustment circuit 530 generates an offset control signal OCC02 used for adjusting the offset of the differential amplifiers 510 and 520 in response to the output signal TOUT of the temperature sensor. The first differential amplifier 510 amplifies a voltage difference between the reference voltage OREF and the temperature sensing voltage OTA in response to the offset control signal OCC02, and generates the first differential output signal DIF01.

The second differential amplifier 520 amplifies the voltage difference between the reference voltage OREF and the temperature sensing voltage OTA in response to the offset control signal OCC02, and generates the second differential output signal DIF02.

Figure 15:
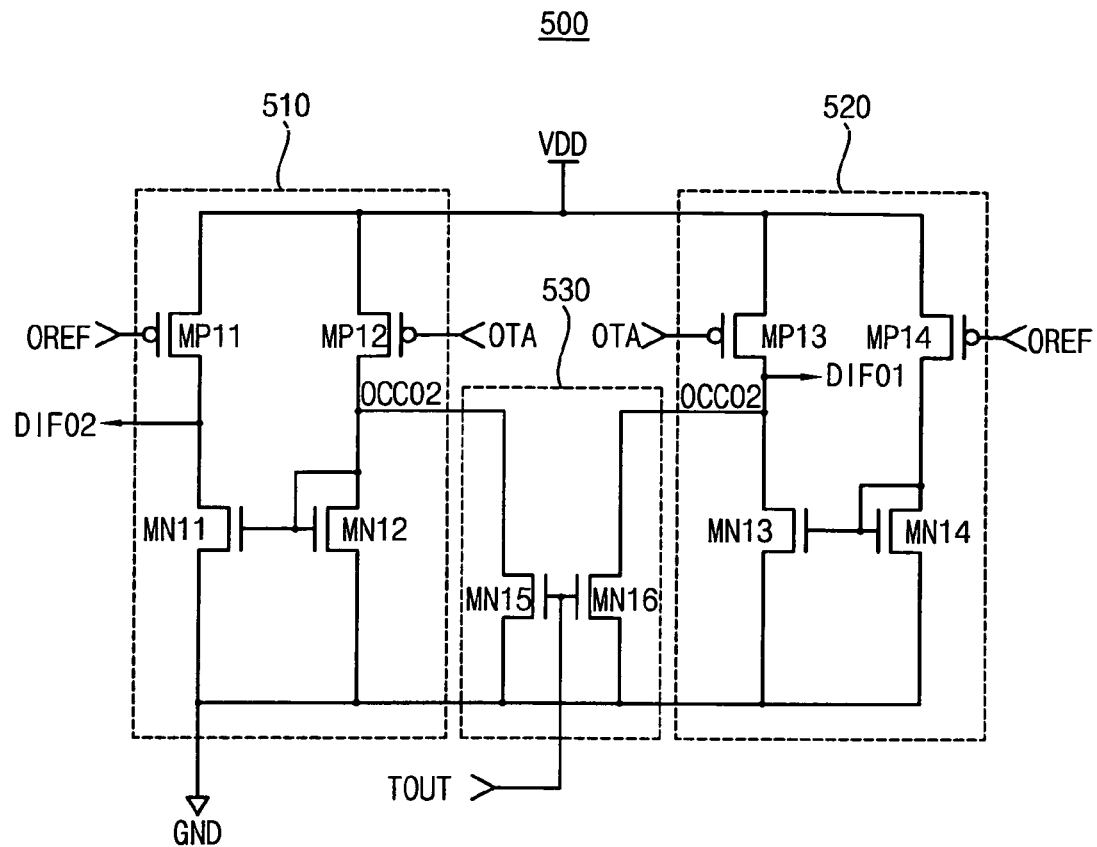
FIG. 15 is a detailed circuit diagram illustrating a sensing temperature controller shown in FIG. 14.

FIG. 15 is a detailed circuit diagram illustrating a sensing temperature controller 500 shown in FIG. 14. The sensing temperature controller 500 includes an offset adjustment circuit 530, a first differential amplifier 510 and a second differential amplifier 520.

The second differential amplifier 520 includes PMOS transistors MP13 and MP14, and NMOS transistors MN13 and MN14. The PMOS transistor MP13 has a source coupled to a high power voltage VDD, a gate to which the temperature sensing voltage OTA is applied and a drain from which the first differential output signal DIF01 is output. The PMOS transistor MP14 has a source coupled to the high power voltage VDD and a gate to which the reference voltage OREF is applied. The NMOS transistor MN13 has a drain coupled to the drain of the PMOS transistor MP13, a gate coupled to a drain of the PMOS transistor MP14 and a source coupled to a low power voltage GND. The NMOS transistor MN14 has a drain and a gate commonly coupled to the drain of the PMOS transistor MP14, and a source coupled to the low power voltage GND.

The first differential amplifier 510 includes PMOS transistors MP11 and MP12, and NMOS transistors MN11 and MN12. The PMOS transistor MP11 has a source coupled to the high power voltage VDD, a gate to which the reference voltage OREF is applied and a drain from which the second differential output signal DIF02 is output. The PMOS transistor MP12 has a source coupled to the high power voltage VDD and a gate to which the temperature sensing voltage OTA is applied. The NMOS transistor MN11 has a drain coupled to the drain of the PMOS transistor MP11, a gate coupled to a drain of the PMOS transistor MP12 and a source coupled to the low power voltage. The NMOS transistor MN12 has a drain and a gate commonly coupled to the drain of the PMOS transistor MP12, and a source coupled to the low power voltage.

The offset control signal OCC02 is applied to the drain of the NMOS transistor MN12 and the drain of the NMOS transistor MN13. The offset adjustment circuit 530 includes NMOS transistors MN15 and MN16.

The NMOS transistor MN15 has a drain coupled to the drain of the NMOS transistor MN12, a gate to which the output signal TOUT of the temperature sensor is applied and a source coupled to the low power voltage GND. The NMOS transistor MN16 has a drain coupled to the drain of the NMOS transistor MN13, a gate to which the output signal TOUT of the temperature sensor is applied and a source coupled to the low power voltage GND.

Figure 16:
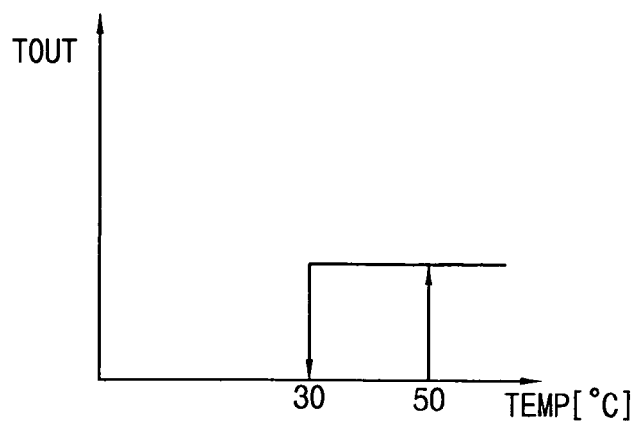
FIG. 16 is a graph illustrating a hysteresis characteristic of a temperature sensor.

FIG. 16 is a graph illustrating a hysteresis characteristic of a temperature sensor. As shown in FIG. 16, the temperature sensor shown in FIG. 13 according to another example embodiment of the present invention feeds back the output signal TOUT to the sensing temperature controller 500. Thus, the output signal TOUT of the temperature sensor defines the hysteresis characteristic of the circuit. When the output signal TOUT of the temperature sensor has the hysteresis characteristic defined in relation to variations of the peripheral temperature, signals transferred between an incorporating memory device and a corresponding memory controller enjoy a more robust immunity to transmission channel noise. Consequently, the temperature sensor shown in FIG. 13 provides more stable performance in relation to a constituent temperature sensing process.

As described above, the temperature sensor according to example embodiments of the present invention may variously change the sensing temperature by adjusting the offset of the differential amplifiers included in the sensing temperature controller. Additionally, the temperature sensor according to example embodiments of the present invention may be used for changing the refresh cycle of a semiconductor memory device.

Furthermore, the temperature sensor and the temperature sensing method according to example embodiments of the present invention may linearly change the sensing temperature.

While the example embodiments of the present invention and their advantages have been described in some detail, it should be understood that various changes, substitutions and alterations may be made herein without departing from the scope of the invention as defined by the following claims.

What is claimed is:

1. A temperature sensor comprising:
    a reference voltage generator configured to generate a reference voltage that varies in accordance with variations of a peripheral temperature in a relationship characterized by a first slope, and a temperature sensing voltage that varies in accordance with variations of the peripheral temperature in a relationship characterized by a second slope;
    a first differential amplifier configured to amplify a voltage difference between a first differential output signal and a second differential output signal to generate a sensor output signal;
    a latch configured to latch an output signal of the first differential amplifier; and
    a sensing temperature controller comprising:
        a second differential amplifier configured to generate the first differential output signal in accordance with a first offset control signal, a second offset control signal, the reference voltage, and the temperature sensing voltage;
        a first offset adjustment circuit configured to generate the first offset control signal in response to a first control signal, wherein an offset of the second differential amplifier is selectively adjusted in accordance with the first offset control signal;
        a third differential amplifier configured to generate the second differential output signal in accordance with the reference voltage, the temperature sensing voltage, the first offset control signal, and the second offset control signal; and
        a second offset adjustment circuit configured to generate the second offset control signal in response to a second control signal having a logic level opposite a logic level of the first control signal, wherein the offset of the second differential amplifier and an offset of the third differential amplifier are downwardly adjusted in accordance with the second offset control signal,
    wherein the first and second differential output signals vary differently with respect to the peripheral temperature, and
    wherein the offset of the second differential amplifier and the offset of the third differential amplifier are upwardly adjusted in accordance with the first offset control signal.

2. The temperature sensor of claim 1, wherein the second differential amplifier has an inverted input terminal to which the temperature sensing voltage is applied, a non-inverted input terminal to which the reference voltage is applied and an output terminal from which the first differential output signal is output.

3. The temperature sensor of claim 2, wherein the third differential amplifier has an inverted input terminal to which the reference voltage is applied, a non-inverted input terminal to which the temperature sensing voltage is applied and an output terminal from which the second differential output signal is output.

4. The temperature sensor of claim 1, wherein the second differential amplifier comprises:
    a first PMOS transistor having a source coupled to a high power voltage, a gate to which the temperature sensing voltage is applied and a drain coupled to a first node;
    a second PMOS transistor having a source coupled to the high power voltage, a gate to which the reference voltage is applied and a drain coupled to a second node;

a first NMOS transistor having a drain coupled to the first node, a gate coupled to the second node and a source coupled to a low power voltage; and a second NMOS transistor having a drain and a gate coupled to the second node, and a source coupled to the low power voltage, and wherein the first node receives the second offset control signal and outputs the first differential output signal, and the second node receives the first offset control signal.

5. The temperature sensor of claim 4, wherein the third differential amplifier comprises:

a third PMOS transistor having a source coupled to the high power voltage, a gate to which the reference voltage is applied and a drain coupled to a third node;

a fourth PMOS transistor having a source coupled to the high power voltage, a gate to which the reference voltage is applied and a drain coupled to a fourth node;

a third NMOS transistor having a drain coupled to the third node, a gate coupled to the fourth node and a source coupled to the low power voltage; and a fourth NMOS transistor having a drain and a gate coupled to the fourth node, a source coupled to the low power voltage, and wherein the third node receives the first offset control signal and outputs the second differential output signal, and the fourth node receives the second offset control signal.

6. The temperature sensor of claim 5, wherein the first offset adjustment circuit comprises:

a fifth NMOS transistor having a drain coupled to the second node, a gate to which the first control signal is applied and a source coupled to the low power voltage; and a sixth NMOS transistor having a drain coupled to the third node, a gate to which the first control signal is applied and a source coupled to the low power voltage.

7. The temperature sensor of claim 6, wherein the second offset adjustment circuit comprises:

a seventh NMOS transistor having a drain coupled to the first node, a gate to which the second control signal is applied and a source coupled to the low power voltage; and a eighth NMOS transistor having a drain coupled to the fourth node, a gate to which the second control signal is applied and a source coupled to the low power voltage.

8. A temperature sensor comprising:

a reference voltage generator configured to generate a reference voltage that varies in accordance with variations of a peripheral temperature in a relationship characterized by a first slope, and a temperature sensing voltage that varies in accordance with variations of the peripheral temperature in a relationship characterized by a second slope;

a first differential amplifier configured to amplify a voltage difference between a first differential output signal and a second differential output signal to generate a sensor output signal;

a latch configured to latch an output signal of the first differential amplifier; and a sensing temperature controller comprising:

a second differential amplifier configured to generate the first differential output signal in accordance with a first offset control signal, a second offset control signal, the reference voltage, and the temperature sensing voltage; and a first offset adjustment circuit configured to generate the first offset control signal in accordance with a first control signal and an N-bit digital code, wherein an offset of the second differential amplifier is selectively adjusted in accordance with the first offset control signal, a third differential amplifier generating the second differential output signal in accordance with the first offset control signal, the second offset control signal, the reference voltage, and the temperature sensing voltage;

a first offset setting circuit configured to generate a first offset current in accordance with the reference voltage and the N-bit digital code, wherein a first offset adjustment value is set in accordance with the first offset current;

a second offset setting circuit configured to generate a second offset current in accordance with the temperature sensing voltage and the N-bit digital code, wherein a second offset adjustment value is set in accordance with the second offset current; and a second offset adjustment circuit configured to generate a second offset control signal in accordance with the second offset current and a second control signal having a logic level opposite a logic level of the first control signal, wherein the first and second differential output signals vary differently with respect to the peripheral temperature, wherein the offset of the second differential amplifier and an offset of the third differential amplifier are downwardly adjusted in accordance with the second offset control signal, and wherein the offset of the second differential amplifier and the offset of the third differential amplifier are upwardly adjusted in accordance with the first offset control signal.

9. The temperature sensor of claim 8, wherein the second differential amplifier has an inverted input terminal to which the temperature sensing voltage is applied, a non-inverted input terminal to which the reference voltage is applied and an output terminal from which the first differential output signal is output.

10. The temperature sensor of claim 9, wherein the third differential amplifier has an inverted input terminal to which the reference voltage is applied, a non-inverted input terminal to which the temperature sensing voltage is applied and an output terminal from which the second differential output signal is output.

11. The temperature sensor of claim 8, wherein the second differential amplifier comprises:

a first PMOS transistor having a source coupled to a high power voltage, a gate to which the temperature sensing voltage is applied and a drain coupled to a first node;

a second PMOS transistor having a source coupled to the high power voltage, a gate to which the reference voltage is applied and a drain coupled to a second node;

a first NMOS transistor having a drain coupled to the first node, a gate coupled to the second node and a source coupled to a low power voltage; and a second NMOS transistor having a drain and a gate coupled to the second node, and a source coupled to the low power voltage, and wherein the first node receives the second offset control signal and outputs the first differential output signal, and the second node receives the first offset control signal.

12. The temperature sensor of claim 11, wherein the third differential amplifier comprises:

a third PMOS transistor having a source coupled to the high power voltage, a gate to which the reference voltage is applied and a drain coupled to a third node;

a fourth PMOS transistor having a source coupled to the high power voltage, a gate to which the temperature sensing voltage is applied and a drain coupled to a fourth node;

a third NMOS transistor having a drain coupled to the third node, a gate coupled to the fourth node and a source coupled to the low power voltage; and a fourth NMOS transistor having a drain and a gate coupled to the fourth node, a source coupled to the low power voltage, and wherein the third node receives the first offset control signal and outputs the second differential output signal, and the fourth node receives the second offset control signal.

13. The temperature sensor of claim 12, wherein the first offset adjustment circuit comprises:

a fifth NMOS transistor having a drain coupled to the second node and a gate to which the first offset current is applied;

a sixth NMOS transistor having a drain coupled to the third node and a gate to which the first offset current is applied;

a seventh NMOS transistor having a gate and a drain to which the first offset current is applied;

an eighth NMOS transistor having a drain coupled to a source of the fifth NMOS transistor, a gate to which the first control signal is applied and a source coupled to the low power voltage;

a ninth NMOS transistor having a drain coupled to a source of the sixth NMOS transistor, a gate to which the first control signal is applied and a source coupled to the low power voltage; and a tenth NMOS transistor having a drain coupled to a source of the seventh NMOS transistor, a gate to which the first control signal is applied and a source coupled to the low power voltage.

14. The temperature sensor of claim 12, wherein the second offset adjustment circuit comprises:

a fifth NMOS transistor having a drain coupled to the first node and a gate to which the second offset current is applied;

a sixth NMOS transistor having a drain coupled to the fourth node and a gate to which the second offset current is applied;

a seventh NMOS transistor having a gate and a drain to which the second offset current is applied;

an eighth NMOS transistor having a drain coupled to a source of the fifth NMOS transistor, a gate to which the second control signal is applied and a source coupled to the low power voltage;

a ninth NMOS transistor having a drain coupled to a source of the sixth NMOS transistor, a gate to which the second control signal is applied and a source coupled to the low power voltage; and a tenth NMOS transistor having a drain coupled to a source of the seventh NMOS transistor, a gate to which the second control signal is applied and a source coupled to the low power voltage.

15. The temperature sensor of claim 8, wherein the first offset setting circuit comprises:

first PMOS transistors having a source commonly coupled to the high power voltage and a gate commonly controlled based on the reference voltage, a number of the first PMOS transistors being N; and second PMOS transistors having a source coupled to a drain of each of the first PMOS transistors, a gate controlled based on each bit constituting the N-bit digital code and a drain from which the first offset current is output, a number of the second PMOS transistors being N.

16. The temperature sensor of claim 8, wherein the second offset setting circuit comprises:

first PMOS transistors having a source commonly coupled to the high power voltage and a gate commonly controlled based on the temperature sensing voltage, a number of the first PMOS transistors being N; and second PMOS transistors having a source coupled to a drain of each of the first PMOS transistors, a gate controlled based on each bit constituting the N-bit digital code and a drain from which the second offset current is output, a number of the second PMOS transistors being N.

17. A temperature sensor comprising:

a reference voltage generator configured to generate a reference voltage that varies in accordance with variations of a peripheral temperature in a relationship characterized b a first slope, and a temperature sensing voltage that varies in accordance with variations of the peripheral temperature in a relationship characterized by a second slope;

a first differential amplifier configured to amplify a voltage difference between a first differential output signal and a second differential output signal to generate a sensor output signal;

a latch configured to latch an output signal of the first differential amplifier; and a sensing temperature controller comprising:

a second differential amplifier configured to generate the first differential output signal in accordance with the sensor output signal an offset control signal the reference voltage and the temperature sensing voltage, a third differential amplifier generating the second differential output signal in accordance with the offset control signal, the reference voltage, and the temperature sensing voltage; and an offset adjustment circuit configured to generate the offset control signal in response to the sensor output signal, wherein an offset of the second differential amplifier is controlled in accordance with the sensor output signal, wherein the first and second differential output signals vary differently with respect to the peripheral temperature, and wherein an offset of the third differential amplifier is selectively adjusted in accordance with the offset control signal.

18. A temperature sensor comprising:

a reference voltage generator configured to generate a reference voltage that varies in accordance with variations of a peripheral temperature in a relationship characterized by a first slope, and a temperature sensing voltage that varies in accordance with variations of the peripheral temperature in a relationship characterized by a second slope;

a first differential amplifier configured to amplify a voltage difference between a first differential output signal and a second differential output signal to generate a sensor output signal; and, a sensing temperature controller comprising:

a second differential amplifier generating the first differential output signal in accordance with first and second offset control signals, the reference voltage, and the temperature sensing voltage;

a first offset adjustment circuit generating the first offset control signal in accordance with a first control signal, wherein an offset of the second differential amplifier is selectively upwardly adjusted in accordance with the first offset control signal; and a second offset adjustment circuit generating the second offset control signal in accordance with a second control signal having a logic level opposite a logic level of the first control signal, wherein the offset of the second differential amplifier is selectively downwardly adjusted in accordance with the second offset control signal;

wherein the sensing temperature controller generates the second differential output signal in accordance with the reference voltage and the temperature sensing voltage, and wherein the first and second differential output signals vary differently with respect to the peripheral temperature.

19. A temperature sensor comprising:

a reference voltage generator configured to generate a reference voltage that varies in accordance with variations of a peripheral temperature in a relationship characterized by a first slope, and a temperature sensing voltage that varies in accordance with variations of the peripheral temperature in a relationship characterized by a second slope;

a first differential amplifier configured to amplify a voltage difference between a first differential output signal and a second differential output signal to generate a sensor output signal; and, a sensing temperature controller comprising:

a second differential amplifier generating the first differential output signal in accordance with first and second offset control signals, the reference voltage, and the temperature sensing voltage;

a first offset adjustment circuit generating the first offset control signal in accordance with a first control signal and an N-bit digital code, wherein an offset of the second differential amplifier is selectively upwardly adjusted in accordance with the first offset control signal; and a second offset adjustment circuit generating the second offset control signal in accordance with the N-bit digital code and a second control signal having a logic level opposite a logic level of the first control signal, wherein the offset of the second differential amplifier is selectively downwardly adjusted in accordance with second offset control signal;

wherein the sensing temperature controller generates the second differential output signal in accordance with the reference voltage and the temperature sensing voltage, and wherein the first and second differential output signals vary differently with respect to the peripheral temperature.

* * * * *